(12) United States Patent
Chang et al.

(10) Patent No.: US 10,818,794 B2
(45) Date of Patent: *Oct. 27, 2020

(54) SEMICONDUCTOR STRUCTURE AND FABRICATING METHOD THEREOF

(71) Applicant: Taiwan Semiconductor Manufacturing Company, Ltd., Hsinchu (TW)

(72) Inventors: Che-Cheng Chang, New Taipei (TW); Tung-Wen Cheng, New Taipei (TW); Chang-Yin Chen, Taipei (TW); Mu-Tsang Lin, Hemei Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/511,364

(22) Filed: Jul. 15, 2019

(65) Prior Publication Data

US 2019/0341493 A1 Nov. 7, 2019

Related U.S. Application Data

(63) Continuation of application No. 15/788,803, filed on Oct. 20, 2017, now Pat. No. 10,355,135, which is a (Continued)

(51) Int. Cl.
*H01L 29/78* (2006.01)
*H01L 21/02* (2006.01)
(Continued)

(52) U.S. Cl.
CPC ...... *H01L 29/7851* (2013.01); *H01L 21/0223* (2013.01); *H01L 21/30604* (2013.01);
(Continued)

(58) Field of Classification Search
CPC ............... H01L 21/02293; H01L 21/20; H01L 21/2033; H01L 21/2036; H01L 21/28114; H01L 21/36; H01L 21/823814; H01L 29/41783; H01L 29/66553; H01L 29/6656; H01L 29/66636; H01L 29/7834
See application file for complete search history.

(56) References Cited

U.S. PATENT DOCUMENTS 6,074,900 A  6/2000 Yamazaki et al.
6,271,094 B1  8/2001 Boyd et al.
(Continued)

FOREIGN PATENT DOCUMENTS

CN  103579340 A  2/2014
JP  2000022145 A  1/2000
(Continued)

*Primary Examiner* — David C Spalla
(74) *Attorney, Agent, or Firm* — Slater Matsil, LLP

(57) ABSTRACT

A semiconductor structure and a method of fabricating the semiconductor structure are provided. The semiconductor structure includes a substrate; a metal gate structure on the substrate; and a spacer next to the metal gate structure having a skirting part extending into the metal gate structure and contacting the substrate. The metal gate structure includes a high-k dielectric layer and a metal gate electrode on the high-k dielectric layer.

20 Claims, 11 Drawing Sheets

Related U.S. Application Data continuation of application No. 14/478,915, filed on Sep. 5, 2014, now Pat. No. 9,812,577.

(51) Int. Cl.
*H01L 21/306* (2006.01)
*H01L 21/3105* (2006.01)
*H01L 21/311* (2006.01)
*H01L 21/3213* (2006.01)
*H01L 29/08* (2006.01)
*H01L 29/165* (2006.01)
*H01L 29/49* (2006.01)
*H01L 29/51* (2006.01)
*H01L 29/423* (2006.01)
*H01L 29/66* (2006.01)

(52) U.S. Cl.
CPC .. *H01L 21/31055* (2013.01); *H01L 21/31144* (2013.01); *H01L 21/32133* (2013.01); *H01L 21/32139* (2013.01); *H01L 29/0847* (2013.01); *H01L 29/165* (2013.01); *H01L 29/42368* (2013.01); *H01L 29/495* (2013.01); *H01L 29/4958* (2013.01); *H01L 29/4966* (2013.01); *H01L 29/517* (2013.01); *H01L 29/6656* (2013.01); *H01L 29/6681* (2013.01); *H01L 29/66545* (2013.01); *H01L 29/66636* (2013.01); *H01L 29/66795* (2013.01); *H01L 29/7848* (2013.01); *H01L 21/02255* (2013.01); *H01L 21/31116* (2013.01); *H01L 21/31122* (2013.01); *H01L 21/32136* (2013.01); *H01L 29/51* (2013.01)

(56) References Cited

U.S. PATENT DOCUMENTS

| | | | |
|---|---|---|---|
| 6,724,025 | B1 | 4/2004 | Takashima et al. |
| 6,975,014 | B1 | 12/2005 | Krivokapic et al. |
| 7,250,655 | B2 | 7/2007 | Bae et al. |
| 7,564,090 | B2 | 7/2009 | Lee |
| 9,589,803 | B2 | 3/2017 | Chen et al. |
| 10,355,135 | B2 * | 7/2019 | Chang ................ H01L 29/6656 |
| 2002/0000623 | A1 * | 1/2002 | Cho ................ H01L 21/28123 257/388 |
| 2005/0139932 | A1 | 6/2005 | Cho |
| 2006/0157797 | A1 | 7/2006 | Tateshita |
| 2006/0160342 | A1 | 7/2006 | Doczy et al. |
| 2009/0289379 | A1 | 11/2009 | Han et al. |
| 2011/0254105 | A1 | 10/2011 | Cheng et al. |
| 2011/0294269 | A1 | 12/2011 | Wirbeleit et al. |
| 2012/0001254 | A1 | 1/2012 | Kronholz et al. |
| 2012/0043623 | A1 | 2/2012 | Doris et al. |
| 2012/0043624 | A1 | 2/2012 | Liang et al. |
| 2012/0052647 | A1 | 3/2012 | Kim et al. |
| 2013/0109144 | A1 | 5/2013 | Kim et al. |
| 2014/0042491 | A1 * | 2/2014 | Chen ................ H01L 21/32134 257/190 |
| 2014/0151817 | A1 | 6/2014 | Bohr et al. |
| 2015/0069516 | A1 | 3/2015 | Lenox et al. |

FOREIGN PATENT DOCUMENTS

| | | |
|---|---|---|
| JP | 2014158050 A | 8/2014 |
| KR | 1020130045716 A | 5/2013 |

* cited by examiner

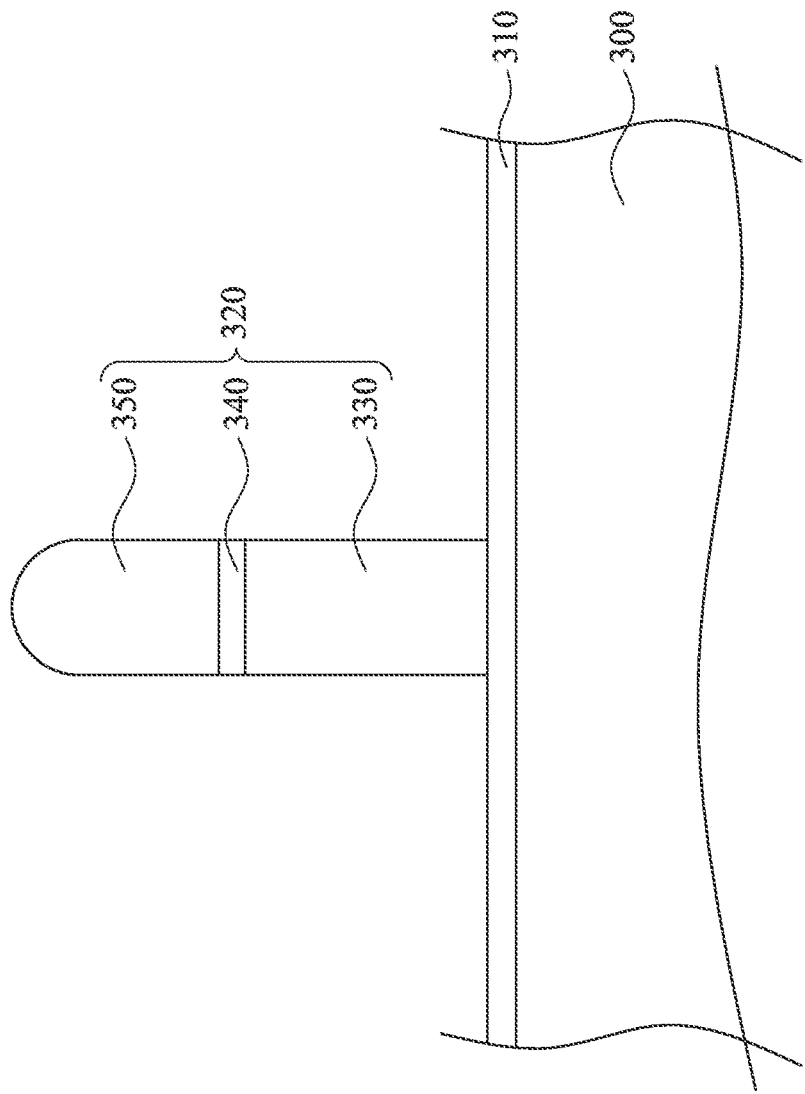

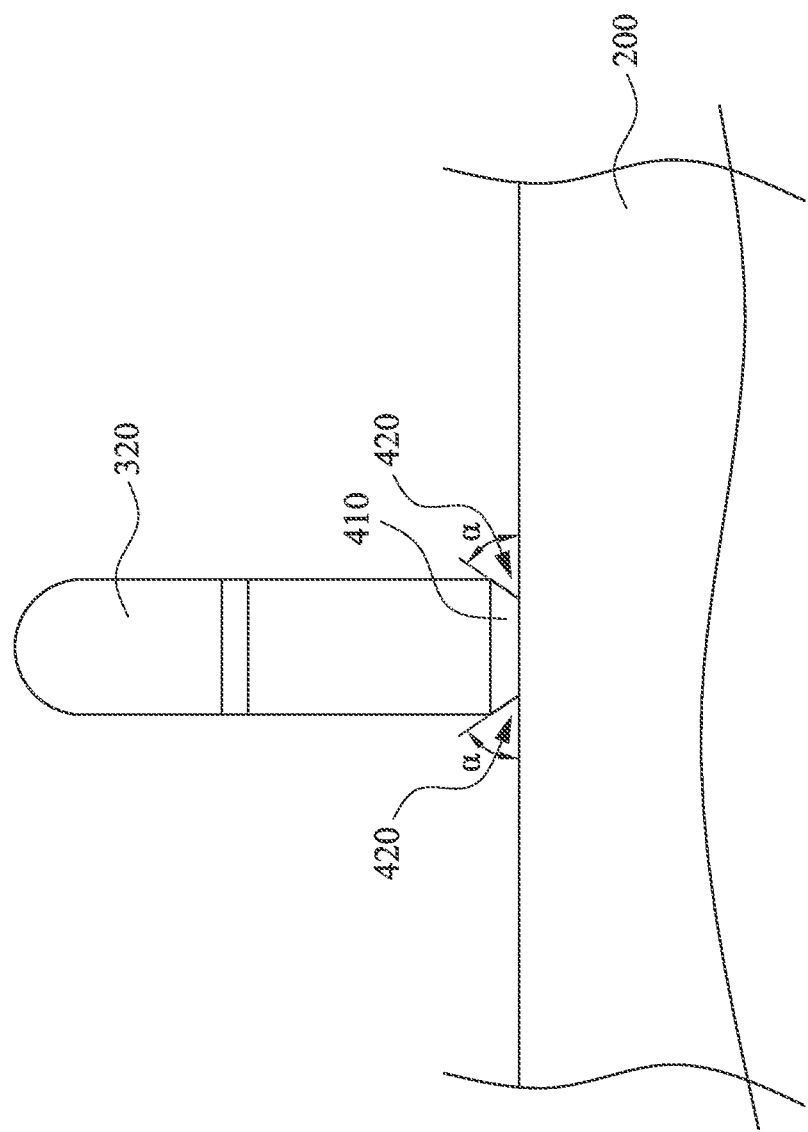

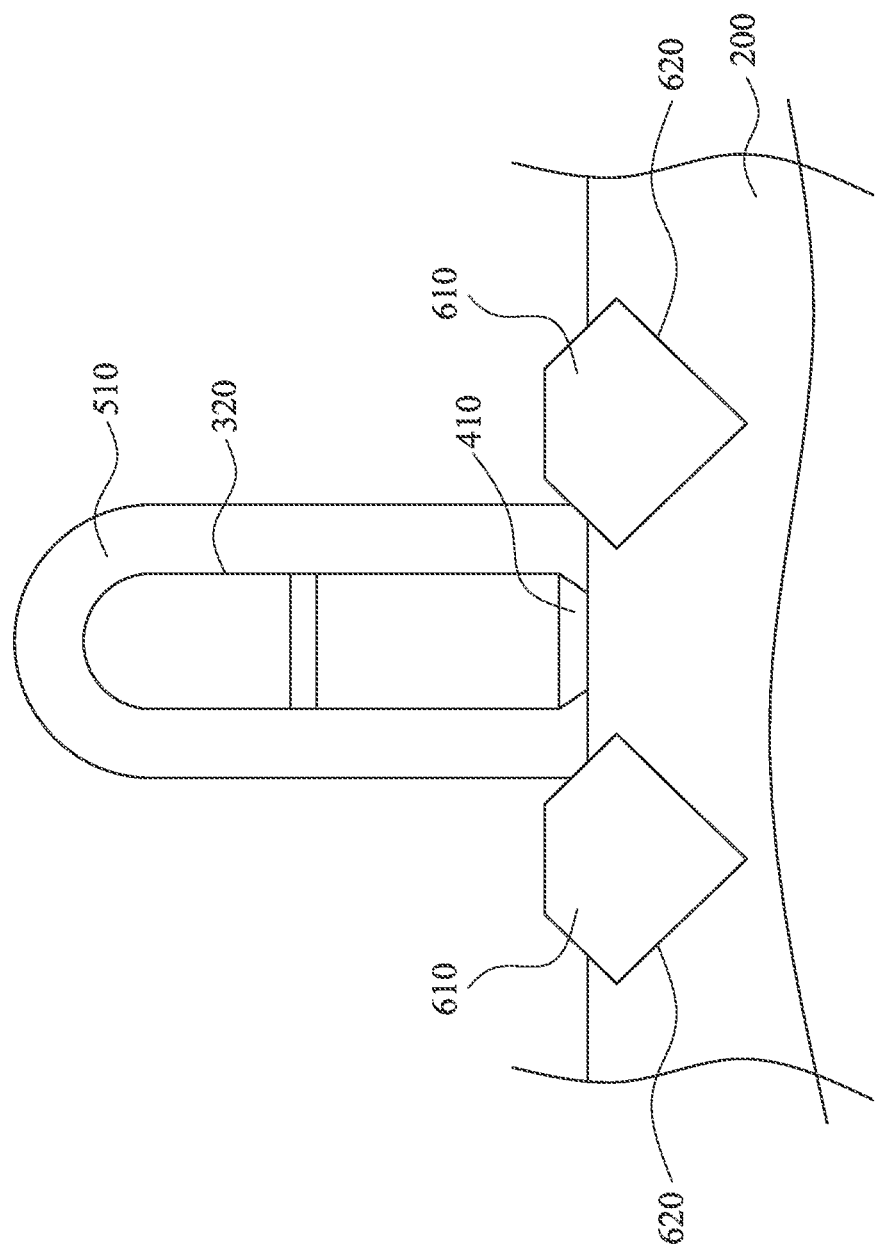

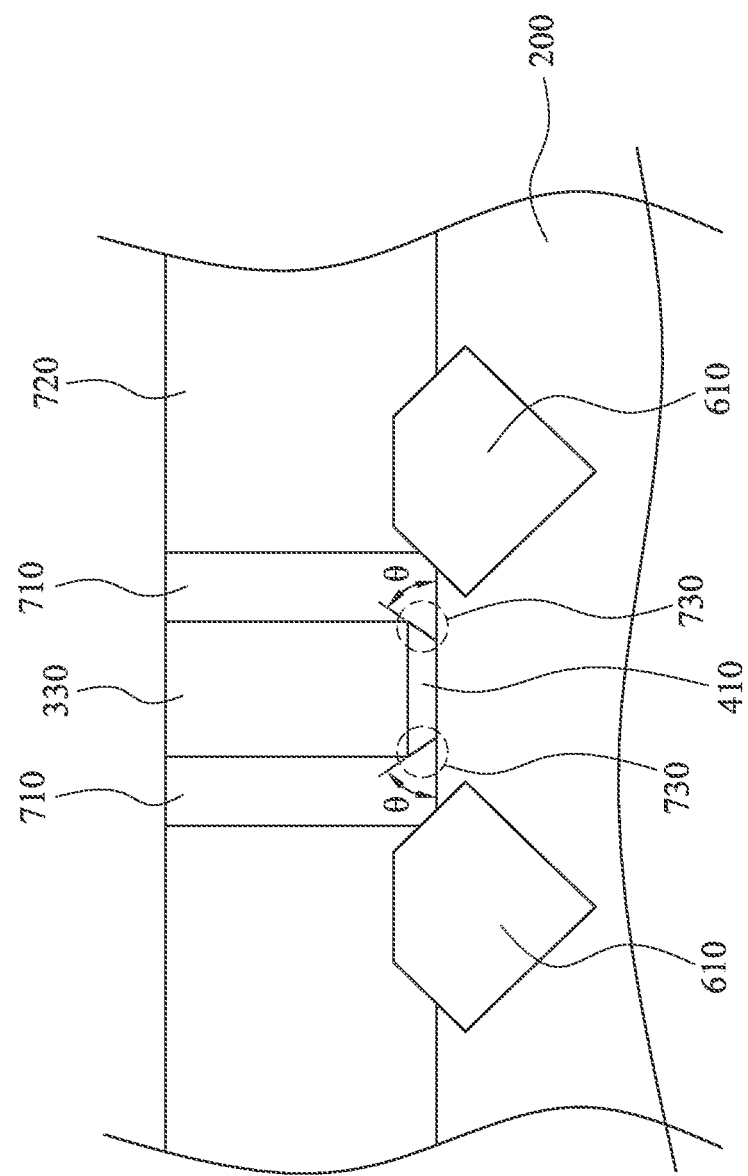

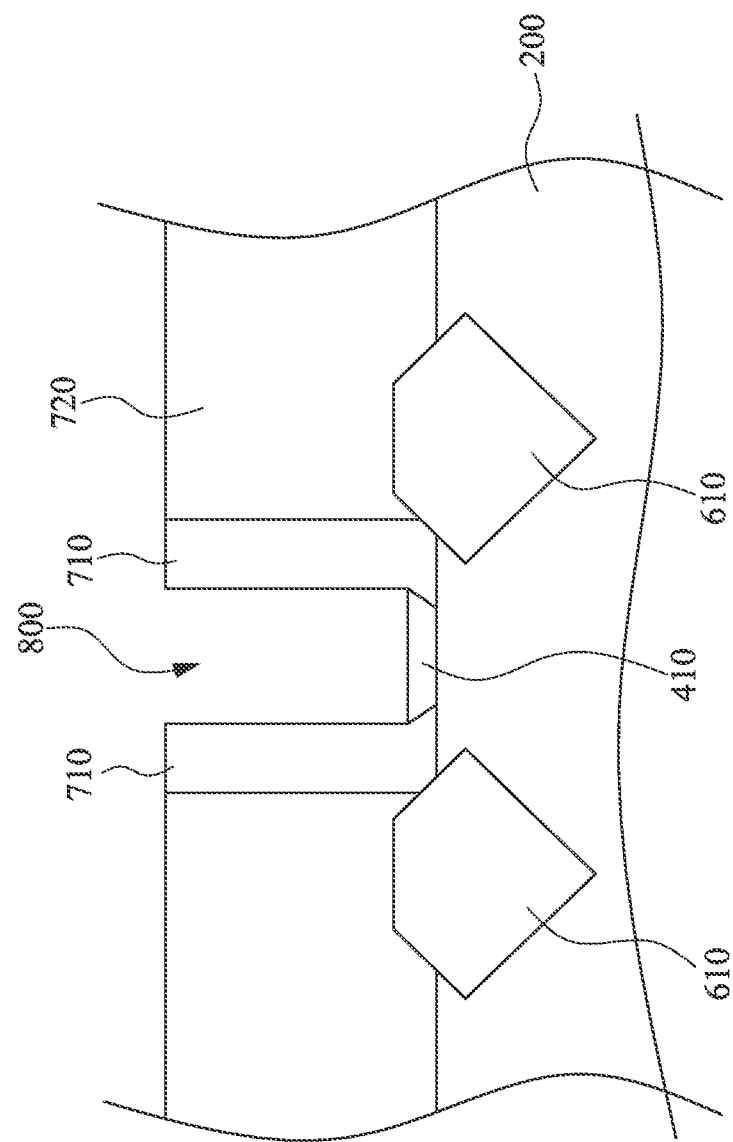

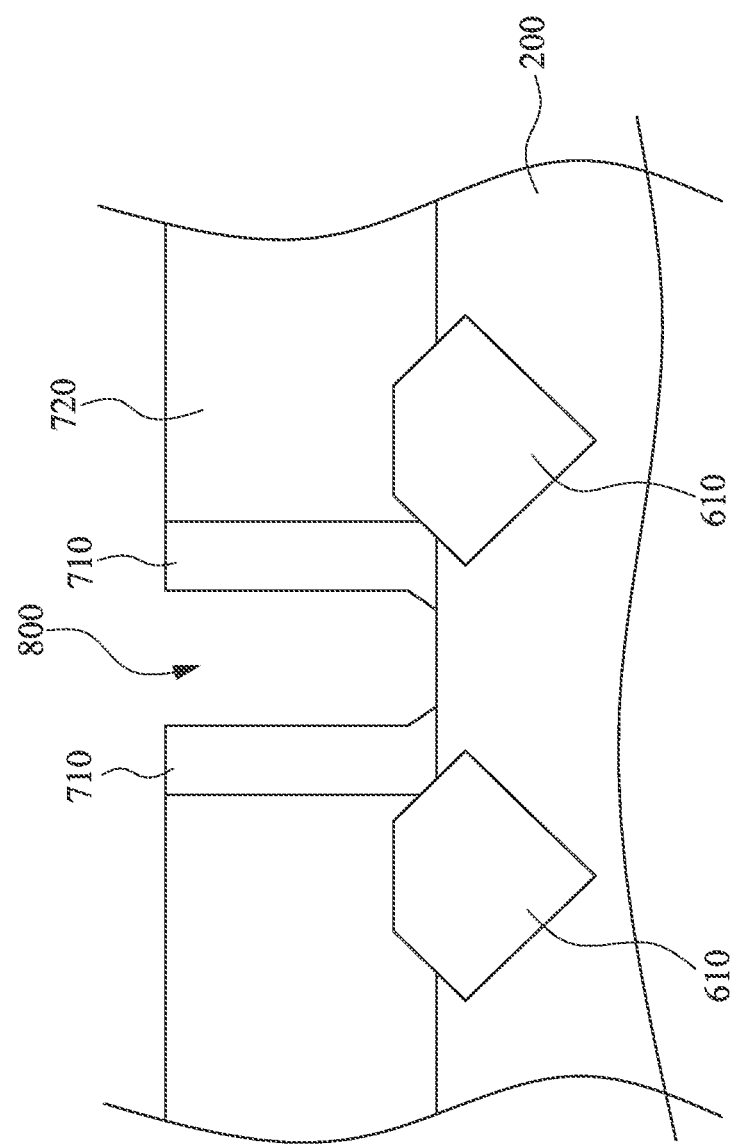

SEMICONDUCTOR STRUCTURE AND FABRICATING METHOD THEREOF

PRIORITY CLAIM AND CROSS-REFERENCE

This application is a continuation of U.S. application Ser. No. 15/788,803, filed on Oct. 20, 2017, which is a continuation of U.S. application Ser. No. 14/478,915, filed on Sep. 5, 2014, now U.S. Pat. No. 9,812,577 issued on Nov. 7, 2017, which applications are incorporated herein by reference in their entirety.

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices, such as transistors, has also increased the complexity of processing semiconductor devices with the decreased feature sizes.

Transistors in the integrated circuit have typically been formed with a silicon gate oxide and polysilicon gate electrode. There has been a desire to replace the silicon gate oxide and polysilicon gate electrode with a high-k gate dielectric and metal gate electrode to improve device performance as feature sizes continue to decrease. Transistor having metal gate electrode, especially in conjunction with high dielectric constant (high-k) dielectric, may address issues such as polysilicon depletion and gate leakage associated with silicon gate oxide. In addition, metal gate transistors exhibit a lower resistivity than doped polysilicon. In the manufacturing process of the metal gate transistors, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are various cross-sectional views of a method of fabricating a semiconductor structure, in accordance with some embodiments.

DETAILED DESCRIPTION

Figure 1:
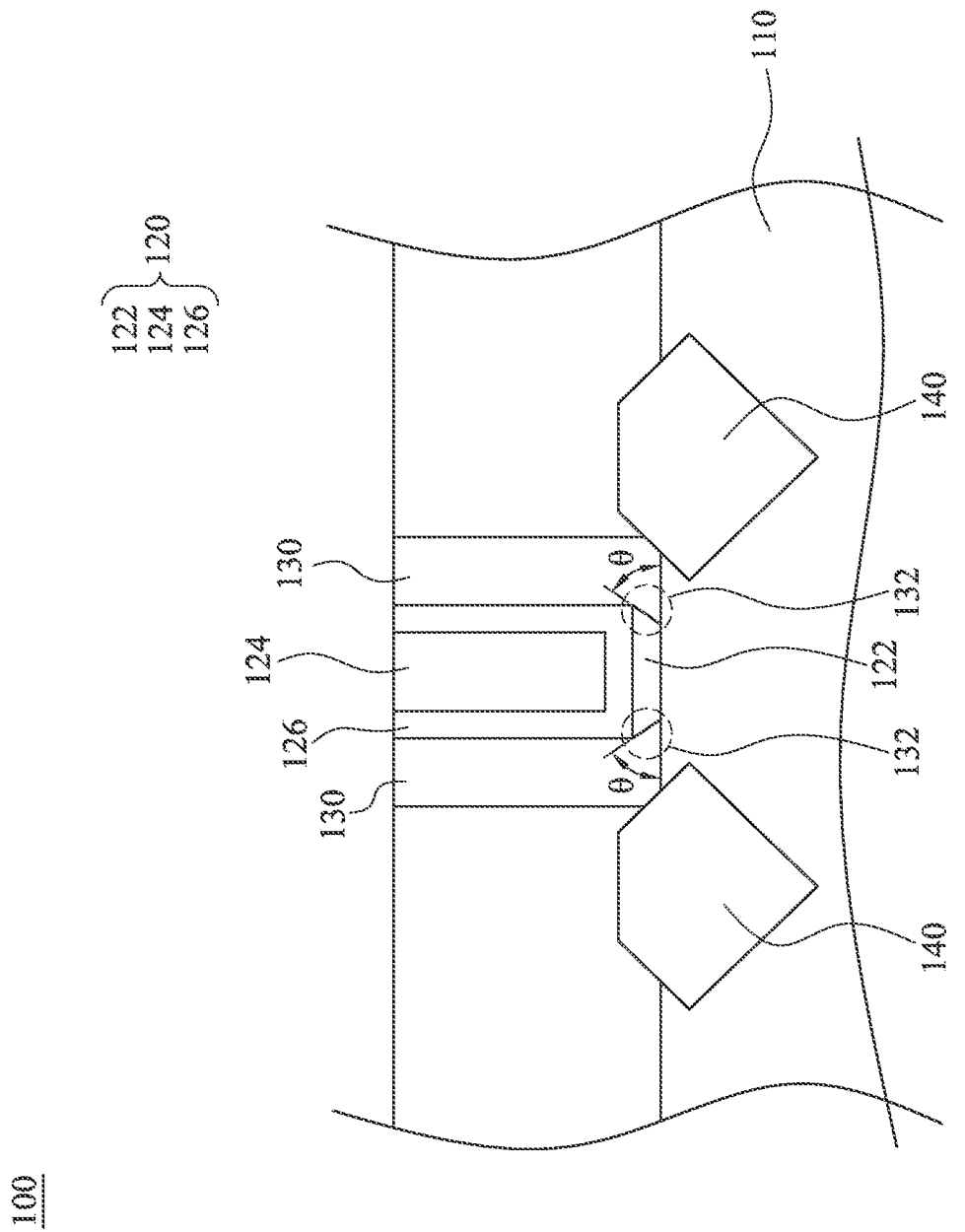
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a gate structure includes a gate oxide layer over a substrate, and a gate electrode and two spacers adjacent to the gate electrode formed over the gate oxide layer. In a metal gate transistor fabricating process, a "gate last" or a "replacement gate" methodology is used. In such a process, a dummy (e.g., sacrificial) gate electrode, which may include polysilicon, is initially formed, various processes associated with the semiconductor device are performed, and the dummy gate electrode is subsequently removed and replaced with a metal gate electrode. When removing the dummy gate electrode, the gate oxide layer under the dummy gate electrode is also removed and replaced with a high-k dielectric layer, but the gate oxide layer under the spacers may also be removed, and a tunnel under the spacers may be formed. A metal leakage issue is therefore formed when forming the metal gate electrode. The metal deposited between the spacers leak to a source/drain region, which may include an epitaxy, through the tunnel under the spacer. And the formed metal gate electrode may have voids in the metal gate electrode, thus affects the transistor performance.

Referring to FIG. 1, FIG. 1 is a cross-sectional view of a semiconductor structure, in accordance with some embodiments. A semiconductor structure 100 includes a substrate 110. A metal gate structure 120 on the substrate 110. A spacer 130 next to the metal gate structure 120 having a skirting part 132 extending into the metal gate structure 120. An epitaxy 140 next to the spacer 130. The semiconductor structure 100 may be intermediate structures fabricated during processing of an integrated circuit, or portion thereof, that may include static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. In some embodiments, the substrate 110 may be a silicon substrate. The substrate 110 may include various doping configurations depending on design requirements as is known in the art (e.g., p-type substrate or n-type substrate). The substrate 110 may include various doped regions, such as source/drain regions, n-well, p-well, and may include shallow trench isolation (STI) regions. The substrate 110 may include a compound semiconductor such as, silicon carbide, gallium arsenide, indium arsenide, or indium phosphide. The metal gate structure 120 includes a high-k dielectric layer 122 on the substrate 110, and a metal gate electrode 124 on the high-k dielectric layer 122. The metal gate electrode 124 may include, tungsten (W), aluminum (Al), titanium (Ti), titanium nitride (TiN), tantalum (Ta), tantalum nitride (TaN), cobalt (Co), copper (Cu), nickel (Ni), combinations thereof, and/or other suitable materials. The high-k dielectric layer 122 may include hafnium oxide (HfO$_2$). Other examples of high-k dielectrics include hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. In various embodiments of the present disclosure, a metal layer 126 may be formed between the high-k dielectric layer 122 and the metal gate electrode 124. The metal layer 126 may be any metal material suitable for forming a metal gate or portion thereof, including work function layers, liner layers, interface layers, seed layers, adhesion layers, barrier layers, etc. The metal layer 126 formed on the high-k dielectric layer may include one or more metal layers including Ti, TiN, TaN, Ta, TaC, TaSiN, W, WN, MoN, MOON, and other suitable materials. Examples of the metal material that may be deposited include P-type metal materials and N-type metal materials. P-type metal materials may include compositions such as ruthenium, palladium, platinum, cobalt, nickel, and conductive metal oxides, and/or other suitable materials. N-type metal materials may include compositions such as hafnium, zirconium, titanium, tantalum, aluminum, metal carbides (e.g., hafnium carbide, zirconium carbide, titanium carbide, aluminum carbide), aluminides, and/or other suitable materials. The spacers 130 are next to the metal gate structure 120 and each of them has a skirting part 132 extending into the metal gate structure 120. The skirting parts 132 contact the substrate 110. In some embodiments, a shape of the skirting part 132 is triangle. The skirting part 132 has a bottom angle θ, wherein the bottom angle θ is in a range about 1° to about 89°. In some embodiments, the bottom angle θ is in a range about 20° to about 70°. For example, the bottom angle θ is 60°. In some embodiments, the skirting part 132 extending into the high-k dielectric layer 122. And the skirting part 132 contacts the substrate 110. In some embodiments, the spacers 130 may include silicon oxide, silicon nitride, silicon oxynitride, silicon carbide, fluoride-doped silicate glass (FSG), a low k dielectric material, combinations thereof, and/or other suitable material. The epitaxy 140 is next to the spacer 130. The epitaxy 140 may include silicon or silicon germanium (SiGe). In some embodiments, the epitaxy may be doped with boron and/or BF$_2$, or phosphorous and/or arsenic. The spacer 130 having the skirting part 132 may protect the metal gate structure 120. The spacer 130 is in direct contact with the substrate 110, which means there have no gate dielectric layer between the spacer 130 and the substrate 110, therefore may prevent the metal leakage issue. The skirting part 132 prolongs a distance between the metal gate structure 120 and the epitaxy 140, which may prevent an etchant etch through the spacers, make the semiconductor structure has better reliability.

In some embodiments, the semiconductor structure may be a portion of a fin type field effect transistor (FinFET). The FinFET has a thin fin extending from the substrate. The channel of the FinFET is formed in this vertical fin. And a gate is formed over (e.g., wrapping) the fin. In some embodiments, the FIG. 1 is a cross-sectional view along the fin of the FinFET. The substrate 110 may be a fin, and a metal gate structure 120 formed over a portion of the fin. Two spacers 130 adjacent to the metal gate structure 120 having a skirting part 132 extending into the metal gate structure 120. And two epitaxies 140 formed in the fin 110 next to the spacers 130. The metal gate structure 120 may include a high-k dielectric layer 122, and a metal electrode 124. In some embodiments, a metal layer is formed between the high-k dielectric layer 122 and the metal electrode 124. The skirting parts 132 contact the substrate 110. In some embodiments, a shape of the skirting part 130 is triangle. The skirting part 130 has a bottom angle θ, wherein the bottom angle θ is in a range about 10° to about 80°. For example, the bottom angle θ is 60°. In some embodiments, the skirting part 132 extending into the high-k dielectric layer 122. The skirting part 132 of the spacer 130 may decrease the metal leakage issue, which is the metal in the metal gate structure 120 leak through or under the spacers 130 to the epitaxy 140.

Figure 2A:
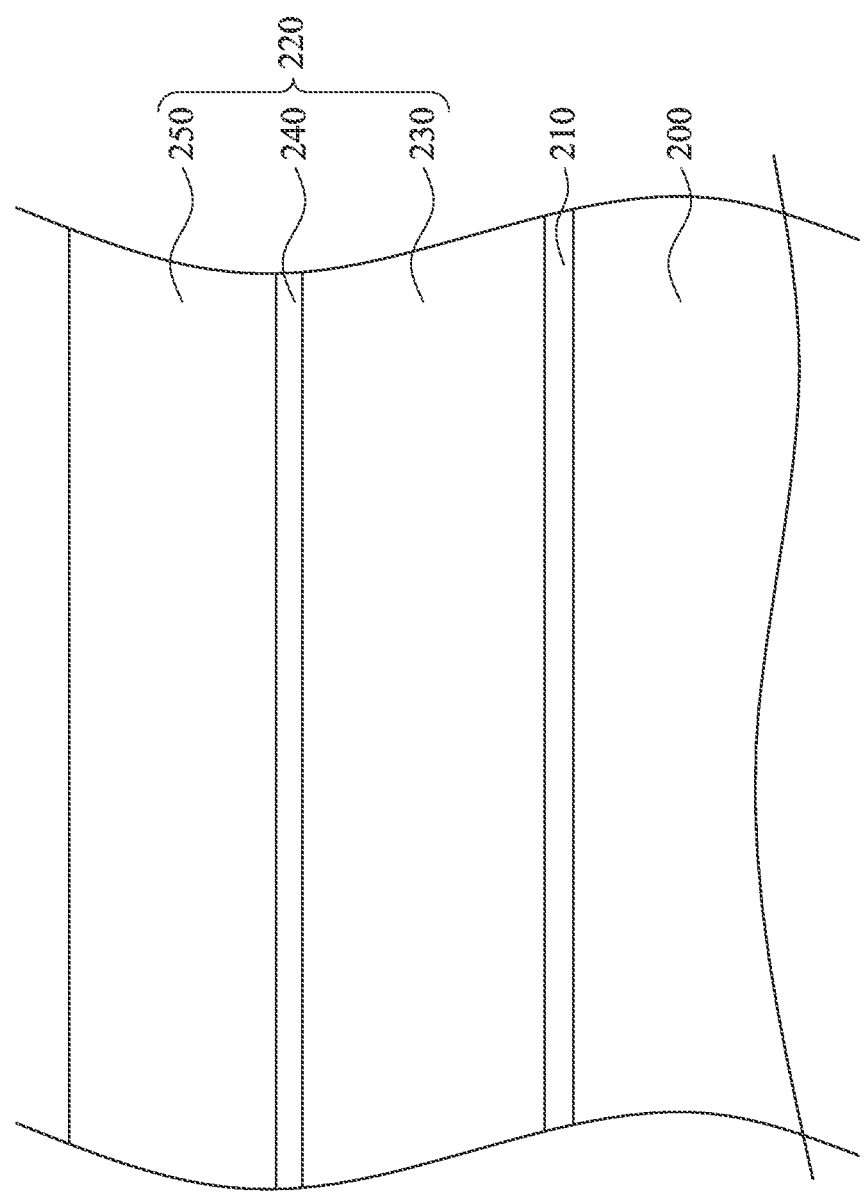

Referring to FIGS. 2A-2I, FIGS. 2A-2I are various cross-sectional views of a method of fabricating a semiconductor structure, in accordance with some embodiments. Referring to FIG. 2A, a gate dielectric layer 210 is formed on a substrate 200, and a dummy gate stack 220 is formed on the gate dielectric layer 210. The substrate 200 may include various doping configurations depending on design requirements as is known in the art (e.g., p-type substrate or n-type substrate). The substrate 200 may include various doped regions, such as source/drain regions, n-well, p-well, and may include shallow trench isolation (STI) regions. The substrate 200 may include a compound semiconductor such as, silicon carbide, gallium arsenide, indium arsenide, or indium phosphide. The gate dielectric layer 210 may be silicon oxide (SiO$_2$), silicon nitride (Si$_3$N$_4$), silicon oxynitride (SiON), hafnium oxide (HfO), titanium nitride (TiN), or combinations thereof. The gate dielectric layer 210 may be formed by thermal oxidation or deposition, such as chemical vapor deposition (CVD), atomic layer deposition (ALD), and/or other suitable process. The dummy gate stack 220 may include a dummy gate layer 230 on the gate dielectric layer 210, a first hard mask layer 240 on the dummy gate layer 230, and a second hard mask layer 250 on the first hard mask layer 240. The dummy gate layer 230 may include polysilicon, silicon, silicon nitride, or other suitable materials. The dummy gate layer 230 may be formed by CVD, PVD, or any suitable methods. The first hard mask layer 240 may include silicon oxide, silicon nitride, silicon oxynitride, silicon carbide, and/or other suitable materials. The first hard mask layer 240 may be formed using methods such as CVD, PVD, or ALD. The second hard mask layer 250 may include may include silicon oxide, silicon nitride, silicon oxynitride, silicon carbide, and other suitable materials. The second hard mask layer 250 may be formed using methods such as chemical vapor deposition CVD, PVD, or ALD.

Referring to FIG. 2B, a dummy gate structure 320 is formed. The dummy gate stack 220 in FIG. 2A is etched to form the dummy gate structure 320. The etching process may include a photolithography and developing process. The etching method may be a dry etching or a wet etching. In some embodiments, the etching method is dry etching, and a gas in the dry etching is selected from a group consisting of HBr, CF$_4$, CHF$_3$, CH$_4$, CH$_2$F$_2$, N$_2$H$_2$, BCl$_3$, SF$_6$, Cl$_2$, N$_2$, H$_2$, O$_2$, He, Ar and combinations thereof. The dry etching may be operated under a pressure in a range from about 1 to about 80 mTorr, a power in a range from about 100 to about 1000 W, and a temperature in a range from about 10 to about 65° C.

Referring to FIG. 2C, the gate dielectric layer 210 is etched, and a recess 420, is formed. Part of the gate dielectric layer 210 is etched to form the gate dielectric layer 410 and the recess 420 under the dummy gate structure 320. In some embodiments, the recess 420 may have a recess angle α. The recess angle α is in a range about 1° to about 89°. In some embodiments, the recess angle α is in a range about 20° to about 70°. For example, the recess angle α is 60°. The recess 420 may be formed by dry etching. In some embodiments, the gas in the dry etching is selected from a group consisting of HBr, $CF_4$, $CHF_3$, $CH_4$, $CH_2F_2$, $N_2H_2$, $BCl_3$, $Cl_2$, $N_2$, $H_2$, $O_2$, He, Ar and combinations thereof. The dry etching may be operated under a pressure in a range from about 1 to about 80 mTorr, a power in a range from about 100 to about 1500 W, and a temperature in a range from about 10 to about 65° C.

Figure 2D:
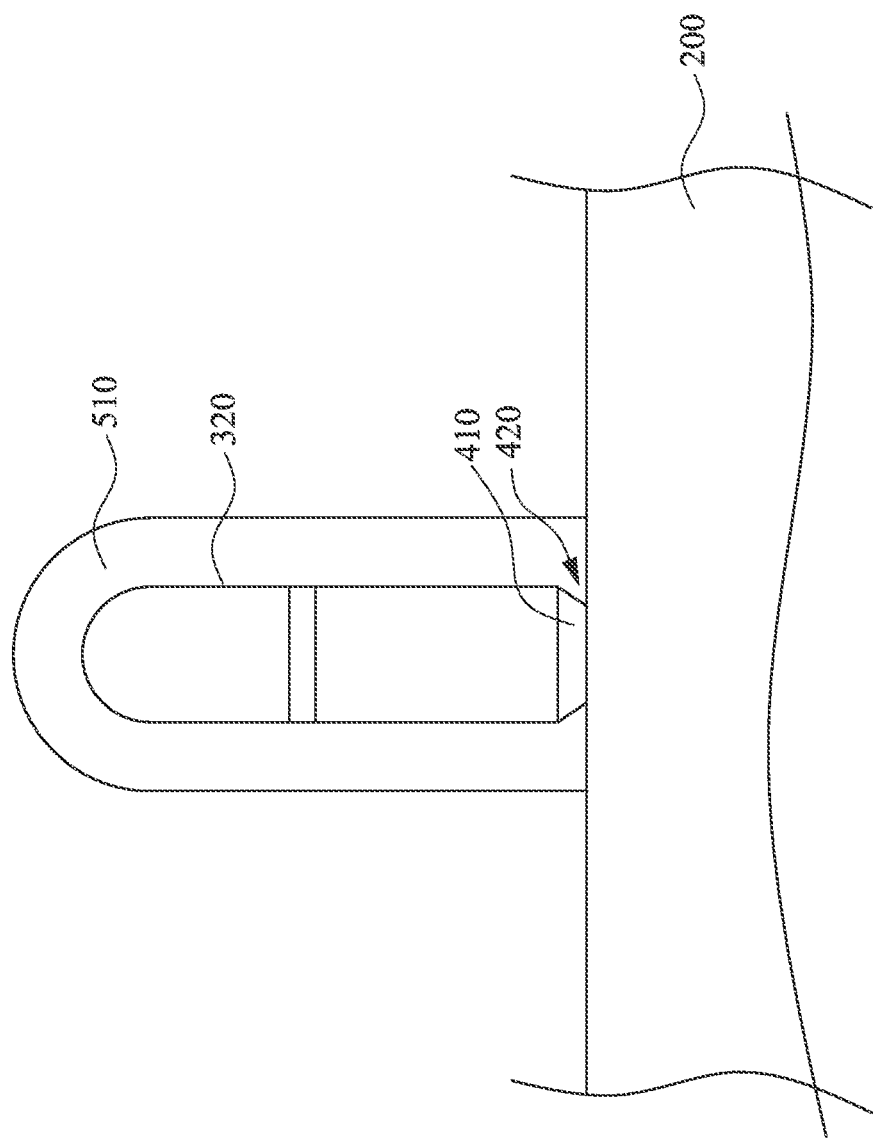

Referring to FIG. 2D, a protection layer 510 surrounding the dummy gate structure 320 is formed. And the protection layer 510 fills the recess 420. The protection layer 510 may be formed by deposition. For example, the deposition process may be CVD, PVD, ALD, or any suitable methods. In some embodiments, part of the protection layer 510 on the substrate may be etched, only the part of the protection layer 510 surrounding the dummy gate structure 320 is left. The protection layer 510 may include silicon oxide, silicon nitride, silicon oxynitride, silicon carbide, fluoride-doped silicate glass (FSG), a low k dielectric material, combinations thereof, or other suitable material. And the material of the protection layer 510 is different from the gate dielectric layer.

Referring to FIG. 2E, an epitaxy 610 is formed next to the protection layer 510. In some embodiments, the epitaxy 610 may be formed by etching the substrate 200 next to the protection layer 510 to form a cavity 620, then growing epitaxy 610 in the cavity 620. The etching process may be a dry etching, a wet etching, or a combination thereof, for example a dry etching first, and then a wet etching performed may form a cavity with a diamond shape. After the cavity 620 is formed, an epitaxial (epi) process is performed to form the epitaxy 610 in the cavity 620. The epi process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, and/or combination thereof. The epi process may use gaseous and/or liquid precursors, which may interact with the composition of the substrate 200. The epitaxy 610 may include silicon or silicon germanium (SiGe). In some embodiments, the epitaxy may be doped with boron and/or $BF_2$, or phosphorous and/or arsenic. In some embodiments, the epitaxy 610 may have a diamond shape or a hexagonal shape.

Referring to FIG. 2F, an inter-layer dielectric (ILD) layer 720 is deposited over the substrate 200. And the dummy gate layer 330 is exposed, and two spacers 710 are formed. The ILD layer 720 may include silicon oxide, silicon oxynitride, flowable oxide, or a low k material. In some embodiments, the ILD layer 720 is formed by deposition, such as chemical vapor deposition (CVD), high density plasma CVD, spin-on, sputtering, or other suitable methods. In a gate last process, the dummy gate structure 320 may be removed so that a resulting metal gate structure may be formed in place of the dummy gate structure 320. Accordingly, the ILD layer 720 may be planarized by a chemical mechanical polishing (CMP) process until a top portion of the dummy gate layer 330 is reached as illustrated in the figure. Therefore, the dummy gate layer 330 is exposed by the CMP process. In some embodiments, part of the ILD layer 720, part of the protection layer 510, the first hard mask layer 340 and the second hard mask layer 350 are removed. In some embodiments, part of the dummy gate layer 330 is also removed. And the two spacers 710 are formed from the protection layer 510. The spacer 710 includes a skirting part 730. The skirting part 730 contact the substrate 200. In some embodiments, a shape of the skirting part 730 is triangle. The skirting part 730 has a bottom angle θ, wherein the bottom angle θ is in a range about 1° to about 89°. In some embodiments, the bottom angle θ is in a range about 20° to about 70°. For example, the bottom angle θ is 60°. In some embodiments, the skirting part 730 extending into the gate dielectric layer 410. In some embodiments, the spacers include silicon oxide, silicon nitride, silicon oxynitride, silicon carbide, fluoride-doped silicate glass (FSG), a low k dielectric material, combinations thereof, or other suitable material.

Referring to FIG. 2G, the dummy gate layer 330 is removed. The dummy gate layer 330 may be removed by a dry etching or a wet etching. The dummy gate layer 330 is etched out, and a trench 800 is formed between the spacers 710. Within the trench 800, a metal gate structure may be formed in following operations. In some embodiments, the dummy gate layer 330 is selectively etched by a wet etch process including exposure to a hydroxide containing solution (e.g., ammonium hydroxide), deionized water, and/or other suitable etchant solutions.

Referring to FIG. 2H, the gate dielectric layer 410 is removed. The gate dielectric layer 410 may be removed by a dry etching or a wet etching. The spacer 710 having the skirting part 730 may prevent the etchant etching through the spacer 710. The spacers 710 are directly contact to the substrate 200, therefore no gate dielectric layer 410 is remained under the spacers 710, and no tunnel under the spacers may be formed during the etching operation. Therefore no metal leakage issue may be formed in the following operations.

Figure 2I:
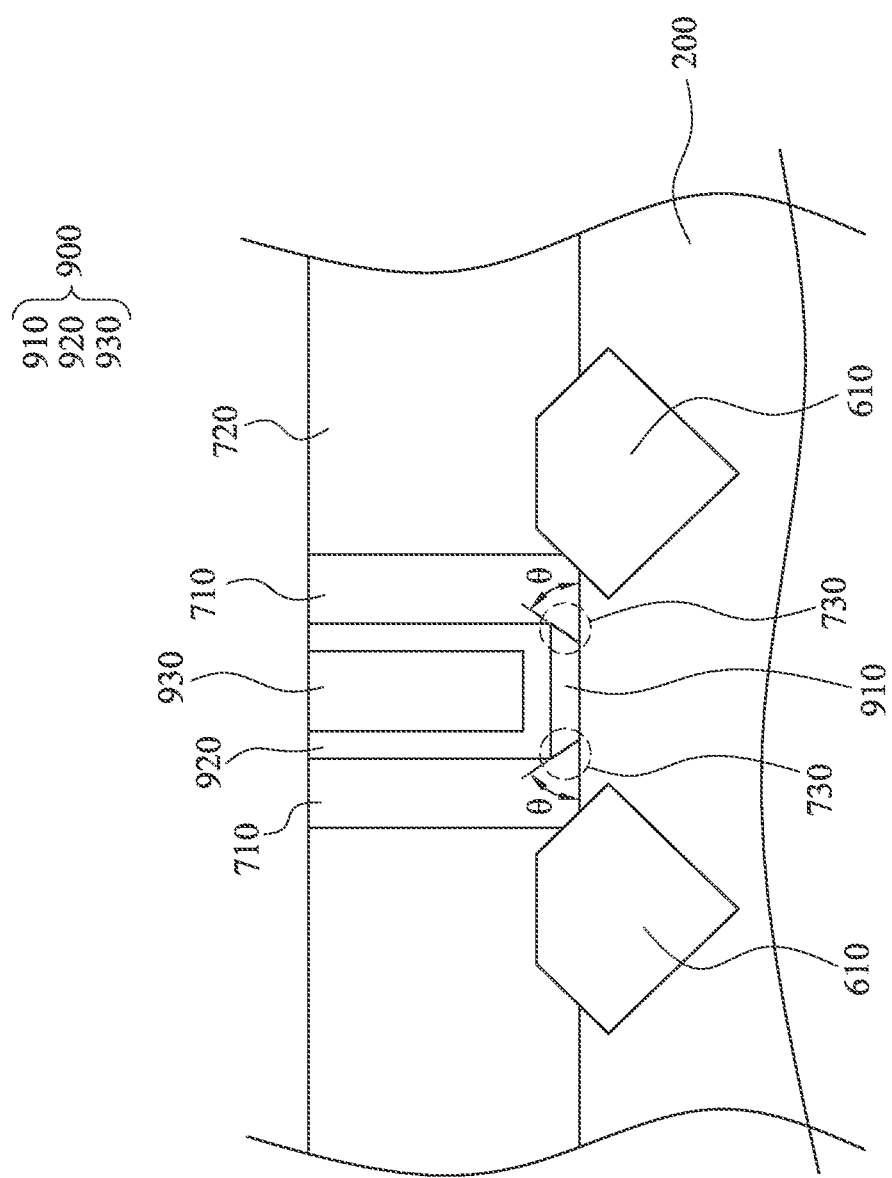

Referring to FIG. 2I, a metal gate structure 900 is formed between the spacers 710. The metal gate structure 900 may formed by a deposition process, such as CVD, PVD, plating, or other suitable processes. In some embodiments, the metal gate structure 900 includes a high-k dielectric layer 910 on the substrate 200, a metal layer 920 formed on the high-k dielectric layer 910, and a metal gate electrode 930 on the metal layer 920. The metal gate electrode 930 may include, tungsten (W), aluminum (Al), titanium (Ti), titanium nitride (TiN), tantalum (Ta), tantalum nitride (TaN), cobalt (Co), copper (Cu), nickel (Ni), combinations thereof, and/or other suitable materials. The high-k dielectric layer 910 may include hafnium oxide ($HfO_2$). Other examples of high-k dielectrics include hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. The metal layer 920 may be any metal material suitable for forming a metal gate or portion thereof, including work function layers, liner layers, interface layers, seed layers, adhesion layers, barrier layers, etc. The metal layer 126 formed on the high-k dielectric layer may include one or more metal layers including Ti, TiN, TaN, Ta, TaC, TaSiN, W, WN, MoN, MOON, and/or other suitable materials. Examples of the metal material that may be deposited include P-type metal materials and N-type metal materials. P-type metal materials may include compositions such as ruthenium, palladium, platinum, cobalt, nickel, and conductive metal oxides, and/or other suitable materials. N-type metal materials may include compositions such as hafnium, zirconium, titanium, tantalum, aluminum, metal carbides (e.g., hafnium carbide, zirconium carbide, titanium carbide, aluminum carbide), aluminides, and/or other suitable materials. After the metal gate structure 900 formed, a CMP process is performed to remove part of the high-k dielectric layer, the metal layer, and the metal electrode on the ILD layer. The spacers 710 have a skirting part 730 extending into the metal gate structure 900, and the skirting parts 730 contact the substrate 200. The skirting part 730 may prevent metal leakage during the operation for forming the metal gate structure 900.

Figure 3:
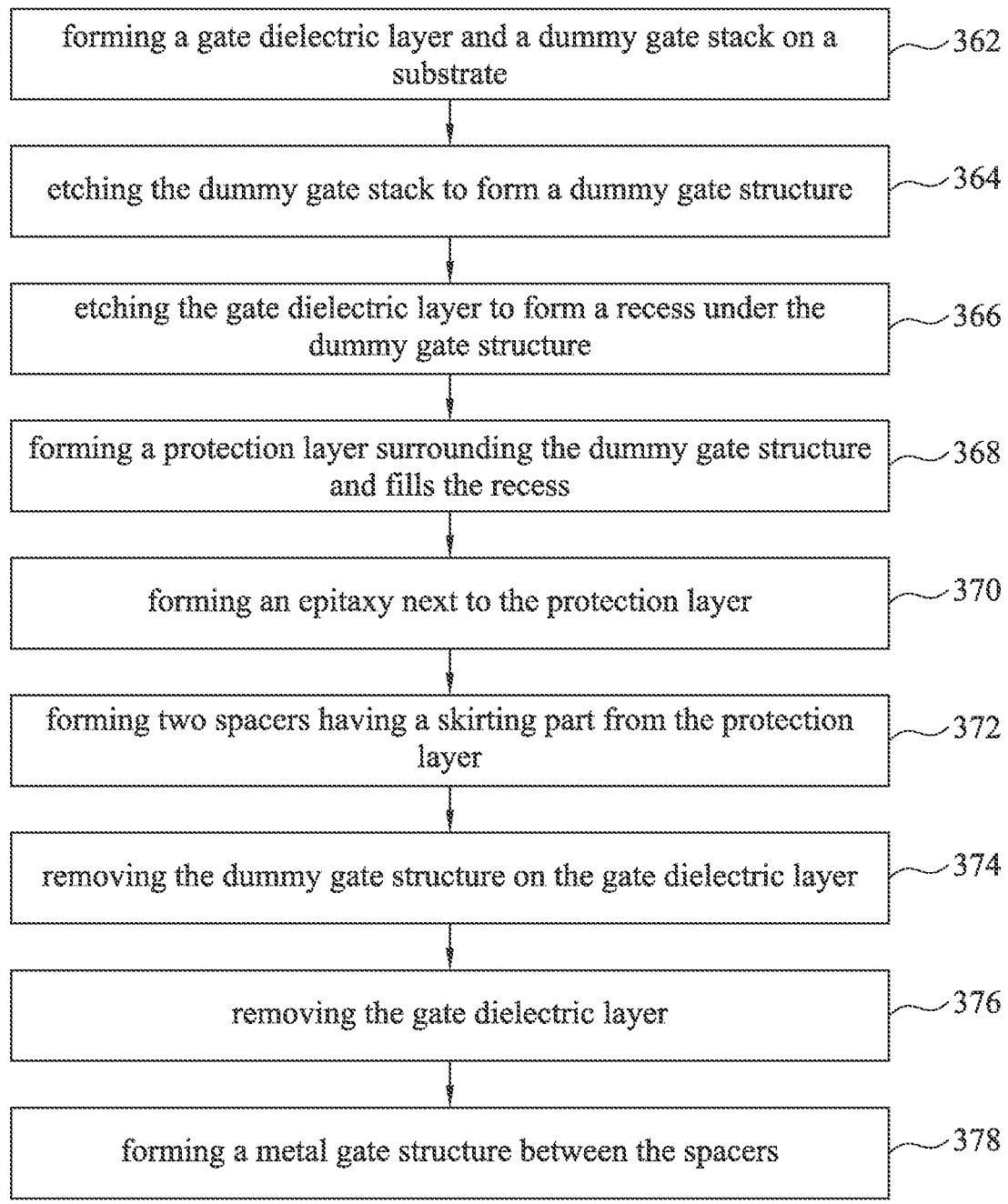
FIG. 3 is a flow chart of the method of fabricating a semiconductor structure, in accordance with some embodiments.

Referring to FIG. 3, FIG. 3 is a flowchart of the method of fabricating a semiconductor structure, in accordance with some embodiments. The method 360 begins with block 362 in which a gate dielectric layer and a dummy gate stack are formed on a substrate. In some embodiments, the substrate may be a silicon substrate. In some embodiments, the dummy gate stack includes a dummy gate layer deposited on the gate dielectric layer, a first hard mask layer deposited on the dummy gate layer, and a second hard mask layer deposited on the first hard mask layer. And the gate dielectric layer may be formed by thermal oxidation or deposition. The method 360 continues with block 364 in which the dummy gate stack is etched to form a dummy gate structure. Then the method 360 continues with block 366 in which the gate dielectric layer is etched to form a recess under the dummy gate structure. In some embodiments, the etching process is dry etching, and a gas in the dry etching is selected from a group consisting of HBr, $CF_4$, $CHF_3$, $CH_4$, $CH_2F_2$, $N_2H_2$, $BCl_3$, $Cl_2$, $N_2$, $H_2$, $O_2$, He, Ar or combination thereof. In some embodiments, the recess has a recess angle $\alpha$ in a range about 1° to about 89°. The method 360 continues with block 368 in which a protection layer surrounding the dummy gate structure is formed. And the protection layer fills the recess. The method 360 continues with block 370 in which an epitaxy next to the protection is formed. Which includes etching the substrate next to the protection layer to form a cavity, and growing an epitaxy in the cavity. In some embodiments, the method 360 further includes depositing an ILD layer over the substrate. The method 360 continues with block 372 in which a spacer having a skirting part is formed from the protection layer. And the dummy gate layer is exposed by a CMP process, which means part of the ILD layer, part of the protection layer, the first hardmask layer and the second hardmask layer are removed. The method 360 continues with block 374 in which the dummy gate structure on the gate dielectric layer is removed. Which includes etching out the dummy gate layer. The method 360 continues with block 376 in which the gate dielectric layer is removed. The method 360 continues with block 378 in which the metal gate structure is formed between the spacers. The metal gate structure may be formed by deposition, which may include a high-k dielectric layer deposited on the substrate, a metal layer deposited on the high-k dielectric layer, and a metal electrode deposited on the metal layer. The method 360 may prevent metal leakage issue when forming the metal gate structure.

In summary, a gate last process may be implemented to form metal gate structures. Problems with forming the metal gate structure may be reduced by etching the gate dielectric layer to form a recess under the dummy gate structure. Therefore the spacers formed next to the dummy gate structure may have skirting part extending into the dummy gate structure, and the skirting parts are directly contacted to the substrate. The dummy gate structure finally may be replaced by the metal gate structure. And the spacer having skirting part may help to decrease the metal leakage issue during replacing the metal gate structure. The skirting part may prevent the etchant etch through the spacers, make the semiconductor structure has better reliability.

According to other various embodiments of the present disclosure, a method of fabricating a semiconductor structure including forming a gate dielectric layer and a dummy gate stack on a substrate. The dummy gate stack is etched to form a dummy gate structure. The gate dielectric layer is etched to form a recess that extends into the gate dielectric layer under the dummy gate structure. A protection layer is formed surrounding the dummy gate structure and filling the recess. A cavity is formed adjacent to the dummy gate structure by etching the substrate and a portion of the protection layer such that the protection layer has an inner-beveled part. An epitaxy is formed in the cavity next to the protection layer. A spacer is formed from the protection layer. The spacer includes a skirting part beneath the dummy gate structure and the inner-beveled part contacting the epitaxy. The dummy gate structure on the gate dielectric layer is removed. A metal gate structure is formed adjacent to the spacer.

According to other various embodiments of the present disclosure, a semiconductor structure includes a substrate, a pair of epitaxies, a metal gate structure, a pair of spacers, and an inter-layer dielectric layer. The epitaxies are over the substrate. The metal gate structure is between the epitaxies and includes a dielectric layer and a metal gate. The dielectric layer is over the substrate. The metal gate is over the dielectric layer. Each of the spacers has a skirting part that extends into the dielectric layer. A distance between the skirting parts is less than a distance between the epitaxies. The inter-layer dielectric layer is over the substrate and in contact with the spacers on the sidewall.

According to other various embodiments of the present disclosure, the semiconductor structure includes a substrate, a metal gate structure, and a spacer. The metal gate structure includes a dielectric layer and a metal gate. The dielectric layer is over the substrate. The metal gate is over the dielectric layer. The spacer has a skirting part in contact with the metal gate and extending into the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate dielectric layer on a substrate;
   forming a dummy gate structure on the dummy gate dielectric layer;
   etching the dummy gate dielectric layer to form a first recess in the dummy gate dielectric layer, the first recess being disposed between the substrate and the dummy gate structure;
   depositing a first dielectric layer along sidewalls of the dummy gate structure and in the first recess; and
   after depositing the first dielectric layer, growing a source/drain region in the substrate, the source/drain region having a faceted surface extending from below a major surface of the substrate to above the major surface of the substrate, the first dielectric layer contacting the faceted surface of the source/drain region, wherein after growing the source/drain region, the first dielectric layer has a beveled corner contacting the source/drain region.

2. The method of claim 1 further comprising:
planarizing the first dielectric layer and the dummy gate structure such that surface of the first dielectric layer and the dummy gate structure are planar, remaining portions of the first dielectric layer after the planarizing forming a spacer; and
replacing the dummy gate dielectric layer and the dummy gate structure with a replacement gate dielectric layer and a replacement gate electrode, the spacer being disposed between the source/drain region and the replacement gate electrode.

3. The method of claim 2, wherein the spacer is a single dielectric material extending continuously between the faceted surface of the source/drain region and a sidewall of the replacement gate dielectric layer.

4. The method of claim 3, wherein after replacing the dummy gate dielectric layer, the sidewall of the replacement gate dielectric layer forms a first angle with the major surface of the substrate, the first angle being in a range of 20 degrees to 70 degrees.

5. The method of claim 1 further comprising:
etching a cavity in the substrate and the sidewall of the first dielectric layer, the source/drain region being grown in the cavity.

6. The method of claim 1 further comprising:
forming an inter-layer dielectric in contact with the first dielectric layer and the faceted surface of the source/drain region.

7. The method of claim 1, wherein the first dielectric layer contacts a portion of the substrate between the source/drain region and the dummy gate dielectric layer.

8. A method comprising:
forming a dummy gate dielectric layer and a dummy gate structure on a substrate;
etching the dummy gate dielectric layer to form a first recess in the dummy gate dielectric layer, the dummy gate dielectric layer having a first sidewall after the etching, the first sidewall forming an acute angle with a major surface of the substrate;
forming a spacer layer on the dummy gate structure and filling the first recess;
growing a source/drain region in the substrate, the source/drain region having a faceted surface raised from the major surface of the substrate;
etching the spacer layer to form a spacer, the spacer having a beveled corner contacting the faceted surface of the source/drain region;
replacing the dummy gate structure with a metal gate structure; and
replacing the dummy gate dielectric layer with a replacement gate dielectric layer, the replacement gate dielectric layer having a second sidewall forming the acute angle with a major surface of the substrate, the spacer contacting the second sidewall of the replacement gate dielectric layer.

9. The method of claim 8, wherein the acute angle is in a range of 20 degrees to 70 degrees.

10. The method of claim 8 further comprising:
etching a cavity in the substrate and a first portion the spacer layer, the source/drain region being grown in the cavity.

11. The method of claim 8, wherein the spacer is a single dielectric material extending continuously between the faceted surface of the source/drain region and the replacement gate dielectric layer.

12. The method of claim 8, wherein the spacer contacts a portion of the substrate between the source/drain region and the replacement gate dielectric layer.

13. The method of claim 8 further comprising:
forming an inter-layer dielectric in contact with the spacer and the faceted surface of the source/drain region; and
planarizing the inter-layer dielectric such that surfaces of the inter-layer dielectric, the spacer, and the metal gate structure are planar.

14. A device comprising:
a gate dielectric layer on a substrate, the gate dielectric layer having a first sidewall, the first sidewall forming an acute angle with a major surface of the substrate;
a gate electrode on the gate dielectric layer;
a source/drain region disposed in the substrate, the source/drain region having a faceted surface raised from the major surface of the substrate; and
a spacer disposed between the source/drain region and the gate electrode, the spacer having a first portion extending along a sidewall of the gate electrode and a second portion disposed partially between the gate dielectric layer and the substrate, the spacer having a beveled corner contacting the faceted surface of the source/drain region.

15. The device of claim 14 further comprising:
an inter-layer dielectric on the source/drain region, the inter-layer dielectric contacting the spacer and the faceted surface of the source/drain region.

16. The device of claim 14, wherein the source/drain region has a first portion extending into the substrate and a second portion over the substrate, the second portion of the source/drain region contacting the beveled corner of the spacer.

17. The device of claim 14, wherein the acute angle is in a range of 20 degrees to 70 degrees.

18. The device of claim 14, wherein the gate dielectric layer has a first width proximate the major surface of the substrate and a second width distal the major surface of the substrate, the first width being less than the second width.

19. The device of claim 14, wherein the spacer contacts the sidewall of the gate electrode.

20. The device of claim 14, wherein the spacer is a single dielectric material extending continuously between the faceted surface of the source/drain region and the first sidewall of the gate dielectric layer.

* * * * *